United States Patent
Shi et al.

(10) Patent No.: US 8,414,789 B2
(45) Date of Patent: Apr. 9, 2013

(54) METHOD AND COMPOSITION FOR CHEMICAL MECHANICAL PLANARIZATION OF A METAL

(75) Inventors: Xiaobo Shi, Chandler, AZ (US); Bentley J. Palmer, Phoenix, AZ (US); Rebecca A. Sawayda, Gilbert, AZ (US); Fadi Abdallah Coder, Chandler, AZ (US); Victoria Perez, Scottsdale, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 354 days.

(21) Appl. No.: 12/632,111

(22) Filed: Dec. 7, 2009

(65) Prior Publication Data

US 2010/0167545 A1  Jul. 1, 2010

Related U.S. Application Data

(60) Provisional application No. 61/141,310, filed on Dec. 30, 2008.

(51) Int. Cl.
*C03C 15/00* (2006.01)
(52) U.S. Cl. ............... 216/88; 438/693; 451/16; 451/41
(58) Field of Classification Search ........................ None
See application file for complete search history.

(56) References Cited

U.S. PATENT DOCUMENTS

| 3,835,046 | A  | * | 9/1974  | Restaino ..................... 210/734 |
| 2004/0014396 | A1 | * | 1/2004  | Elledge ............................. 451/6 |
| 2007/0269987 | A1 | * | 11/2007 | Nakano et al. ................ 438/693 |

OTHER PUBLICATIONS

Steigerwald et al, Chemical Mechanical Planarization of Microelectronic Materials, 2004, Wiley-VCH, p. 36-47.*
Gregory B. Shinn et al, Chemical-Mechanical Polish, Handbook of Semiconductor Manufacturing Technology, 2000, Marcel Dekkar, New York City, pp. 415-460.
D. Zeidler et al, Characterization of Cu chemical mechanical polishing by electrochemical investigations, Microelectronic Engineering 33 (1997), pp. 259-265.
Ronald J. Gutmann et al, Chemical-mechanical polishing of copper with oxide and polymer interlevel dielectrics, Thin Solid Films 270 (1995) pp. 596-600.

* cited by examiner

*Primary Examiner* — Binh X Tran
*Assistant Examiner* — David Cathey, Jr.
(74) *Attorney, Agent, or Firm* — Lina Yang

(57) ABSTRACT

A composition and associated method for chemical mechanical planarization of a metal-containing substrate (e.g., a copper substrate) are described herein which afford high and tunable rates of metal removal as well as low within a wafer non-uniformity values and low residue levels remaining after polishing.

8 Claims, No Drawings

METHOD AND COMPOSITION FOR CHEMICAL MECHANICAL PLANARIZATION OF A METAL

CROSS REFERENCE TO RELATED APPLICATION

The present patent application claims the benefit of U.S. Provisional Patent Application Ser. No. 61/141,310 filed Dec. 30, 2008.

BACKGROUND OF THE INVENTION

Described herein is a method for the chemical-mechanical planarization ("CMP") of metal substrates such as, for example, copper substrates on semiconductor wafers and polishing compositions therefor. More particularly, also described herein is a CMP polishing composition and method comprising same that is effective for use in metal CMP and provides at least one of the following: affords a high level of metal removal, affords a desirable low level of within a wafer non-uniformity ("WIW NU %"), and results in low residue level(s) being present on polished wafer(s) subsequent to CMP processing.

Chemical mechanical planarization (also referred to as chemical mechanical polishing) for planarization of semiconductor substrates is now widely known to those skilled in the art and has been described in numerous patents and open literature publications. An introductory reference on CMP is as follows: "Chemical-Mechanical Polish" by G. B. Shinn et al., Chapter 15, pages 415-460, in Handbook of Semiconductor Manufacturing Technology, editors: Y. Nishi and R. Doering, Marcel Dekker, New York City (2000).

In a typical CMP process, a substrate such as a wafer is placed in contact with a rotating polishing pad attached to a platen. A CMP slurry, typically an abrasive and chemically reactive mixture, is supplied to the pad during CMP processing of the substrate. During the CMP process, the pad which may be fixed to the platen and substrate are rotated while a wafer carrier system or polishing head applies pressure such as a downward force against the substrate. The polishing composition accomplishes the planarization (polishing) process by chemically and mechanically interacting with the substrate film being planarized due to the effect of the rotational movement of the pad relative to the substrate. Polishing is continued in this manner until the desired film on the substrate is removed with the usual objective being to effectively planarize the substrate. Typically metal CMP slurries contain an abrasive material, such as silica or alumina, which is suspended in an oxidizing, aqueous medium.

Silicon based semiconductor devices, such as integrated circuits (ICs), typically include a dielectric layer, which can be a low-k dielectric material, silicon dioxide, or other material. Multilevel circuit traces, typically formed from aluminum or an aluminum alloy or copper, are patterned onto the low-k or silicon dioxide substrate.

CMP processing is often employed to remove and planarize excess metal at different stages of semiconductor manufacturing. For example, one way to fabricate a multilevel copper interconnect or planar copper circuit traces on a silicon dioxide substrate is referred to as the damascene process. In a semiconductor manufacturing process typically used to form a multilevel copper interconnect, metallized copper lines or copper vias are formed by electrochemical metal deposition followed by copper CMP processing. In a typical process, the interlevel dielectric (ILD) surface is patterned by a conventional dry etch process to form vias and trenches for vertical and horizontal interconnects and make connection to the sublayer interconnect structures. The patterned ILD surface is coated with an adhesion-promoting layer such as titanium or tantalum and/or a diffusion barrier layer such as titanium nitride or tantalum nitride over the ILD surface and into the etched trenches and vias. The adhesion-promoting layer and/or the diffusion barrier layer is then overcoated with copper, for example, by a seed copper layer and followed by an electrochemically deposited copper layer. Electro-deposition is continued until the structures are filled with the deposited metal. Finally, CMP processing is used to remove the copper overlayer, adhesion-promoting layer, and/or diffusion barrier layer, until a planarized surface with exposed elevated portions of the dielectric (silicon dioxide and/or low-k) surface is obtained. The vias and trenches remain filled with electrically conductive copper forming the circuit interconnects.

When one-step copper CMP processing is desired, it is usually desirable that the removal rate of the metal and barrier layer material be significantly higher than the removal rate for dielectric material in order to avoid or minimize dishing of metal features or erosion of the dielectric. Alternatively, a multi-step copper CMP process may be employed involving the initial removal and planarization of the copper overburden, referred to as a step 1 copper CMP process, followed by a barrier layer CMP process. The barrier layer CMP process is frequently referred to as a barrier or step 2 copper CMP process. Previously, it was believed that the removal rate of the copper and the adhesion-promoting layer and/or the diffusion barrier layer should both greatly exceed the removal rate of dielectric so that polishing effectively stops when elevated portions of the dielectric are exposed. The ratio of the removal rate of copper to the removal rate of dielectric base is called the "selectivity" for removal of copper in relation to dielectric during CMP processing of substrates comprised of copper, tantalum and dielectric material. The ratio of the removal rate of tantalum to the removal rate of dielectric base is called the "selectivity" for removal of tantalum in relation to dielectric during CMP processing. When CMP slurries with high selectivity for removal of copper and tantalum in relation to dielectric are used, the copper layers are easily over-polished creating a depression or "dishing" effect in the copper vias and trenches. This feature distortion is unacceptable due to lithographic and other constraints in semiconductor manufacturing.

Another feature distortion that is unsuitable for semiconductor manufacturing is called "erosion." Erosion is the topography difference between a field of dielectric and a dense array of copper vias or trenches. In CMP, the materials in the dense array maybe removed or eroded at a faster rate than the surrounding field of dielectric. This causes a topography difference between the field of dielectric and the dense copper array.

A typically used CMP slurry has two components: a chemical component and a mechanical component. An important consideration in slurry selection is "passive etch rate." The passive etch rate is the rate at which copper is dissolved by the chemical component alone and should be significantly lower than the removal rate when both the chemical component and the mechanical component are involved. A large passive etch rate leads to dishing of the copper trenches and copper vias, and thus, preferably, the passive etch rate is less than 10 nanometers per minute.

In relation to copper CMP, the current state of this technology involves the use of a two-step process to achieve local and global planarization in the production of IC chips. During step 1 of a copper CMP process, the overburden copper is removed. Then step 2 of the copper CMP process follows to remove the barrier layer and achieve both local and global planarization. Generally, after removal of overburden copper in step 1, polished wafer surfaces have non-uniform local and global planarity due to differences in the step heights at various locations of the wafer surfaces. Low density features tend to have higher copper step heights whereas high density features tend to have low step heights. Due to differences in the step heights after step 1, step 2 copper CMP selective slurries with respect to tantalum to copper removal rates and copper to oxide removal rates are highly desirable. The ratio of the removal rate of tantalum to the removal rate of copper is called the "selectivity" for removal of tantalum in relation to copper during CMP processing of substrates comprised of copper, tantalum and dielectric material.

There are a number of theories as to the mechanism for chemical-mechanical polishing of copper proposing that the chemical component forms a passivation layer on the copper changing the copper to a copper oxide. The copper oxide has different mechanical properties, such as density and hardness, than metallic copper and passivation changes the polishing rate of the abrasive portion. Other proposals disclose that the mechanical component abrades elevated portions of copper and the chemical component then dissolves the abraded material. The chemical component also passivates recessed copper areas minimizing dissolution of those portions. See also: D. Zeidler, Z. Stavreva, M. Ploetner, K. Drescher, "Characterization of Cu Chemical Mechanical Polishing by Electrochemical Investigations" (*Microelectronic Engineering,* 33(104), 259-265 (English) 1997), and Gutmann, et al., entitled "Chemical-Mechanical Polishing of Copper with Oxide and Polymer Interlevel Dielectrics" (*Thin Solid Films,* 1995.

These are two general types of layers that can be polished. The first layer may be interlayer dielectrics (ILD), such as silicon oxide and silicon nitride. The second layer may be metal layers such as tungsten, copper, aluminum, etc., which are used to connect the active devices.

In the case of CMP of metals, the chemical action is generally considered to take one of two forms. In the first mechanism, the chemicals in the solution react with the metal layer to continuously form an oxide layer on the surface of the metal. This generally requires the addition of an oxidizer to the solution such as hydrogen peroxide, ferric nitrate, etc. Then the mechanical abrasive action of the particles continuously and simultaneously removes this oxide layer. A judicious balance of these two processes obtains optimum results in terms of removal rate and polished surface quality.

In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal and enhancing the diffusion of reactants and products to and away from the surface by mixing and by reducing the thickness of the boundary layer.

While prior art CMP systems are capable of removing a copper overlayer from a silicon dioxide substrate, the present systems may not satisfy the rigorous demands of the semiconductor industry. These requirements can be summarized as follows. First, there is a need for high removal rates of copper to satisfy throughput demands. Secondly, there should be excellent topography uniformity across the substrate. Finally, the CMP method should minimize dishing and local erosion effects on polished substrates as well as minimizing defectivity levels to satisfy ever increasing lithographic demands.

There is a significant need for copper CMP process (es) and slurry(s) that afford high metal removal rates that are tunable while at the same time affording low within a wafer non-uniformity values and low polishing residues. These characteristics are important especially in view of the fact that the semiconductor industry continues to move towards smaller and smaller feature sizes.

BRIEF SUMMARY OF THE INVENTION

In one embodiment, described herein is a method for chemical mechanical planarization of a surface having at least one feature thereon comprising a metal, said method comprising the steps of:

A) placing a substrate having the surface having the at least one feature thereon comprising the metal in contact with a polishing pad;

B) delivering a polishing composition comprising:
   a) an abrasive;
   a) an ionic liquid compound; and
   c) an oxidizing agent;
and C) polishing the substrate with the polishing composition.

In one particular embodiment of the method described herein, the ionic liquid compound comprises an imidazolium salt having the general molecular structure:

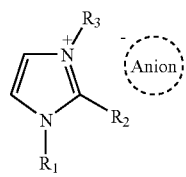

where $R_1$ can be H, normal-alkyl, branched alkyl, alkoxy, alkyl thioether, and other suitable organic groups;

$R_2$ can be any of the following atom or organic groups comprising from 1 to 6 carbon atoms ($C_1$ to $C_6$), including H, normal-alkyl, branched alkyl, alkoxy, and alkyl thioether;

$R_3$ can be any of the following atom or organic groups comprising from 1 to 6 carbon atoms ($C_1$-$C_6$) including normal-alkyl, branched alkyl, alkoxy, alkyl thioether, cyclic and non-aromatic rings, heterocyclic non-aromatic rings and other suitable organic groups; and anion is a univalent or multivalent anion.

In a further embodiment, described herein is a polishing composition comprising:

a) an abrasive;

b) an ionic liquid compound; and c) an oxidizing agent.

In one particular embodiment of the above composition, the ionic liquid compound comprises an imidazolium salt having the general molecular structure:

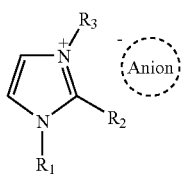

where $R_1$ can be H, normal-alkyl, branched alkyl, alkoxy, alkyl thioether, and other suitable organic groups;

$R_2$ can be any of the following atom or organic groups with comprising from 1 to 6 carbon atoms ($C_1$-$C_6$), including H, normal-alkyl, branched alkyl, alkoxy, and alkyl thioether;

$R_3$ can be any of the following atom or organic groups comprising from 1 to 6 carbon atoms ($C_1$-$C_6$) including normal-alkyl, branched alkyl, alkoxy, alkyl thioether, cyclic and non-aromatic rings, heterocyclic non-aromatic rings and other suitable organic groups; and anion is a univalent or multivalent anion.

DETAILED DESCRIPTION OF THE INVENTION

Described herein are polishing compositions for CMP processing and methods for polishing and, in particular, for chemical mechanical polishing comprising an ionic liquid, an abrasive and an oxidizing agent. Such compositions have been surprisingly and unexpectedly found to provide high levels of metal removal and simultaneously providing desirable low levels of within wafer non-uniformity values ("WIW NU %") during the course of metal CMP (e.g., copper CMP) relative to comparable polishing compositions that do not contain an ionic liquid. Achieving high metal removal rates with tenability, while simultaneously achieving low WIW NU % values during CMP processing may become more important as the semiconductor industry trends to smaller and smaller feature sizes in the manufacture of integrated circuits.

As previously mentioned, the polishing compositions and methods using same comprise an ionic liquid compound. Exemplary ionic liquid compounds that can be used in the method and composition described herein include, but are not limited to, imidazolium salts.

One particular embodiment of suitable imidazolium salts for use in the composition and method described herein have the following molecular structure:

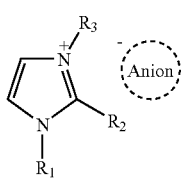

In the above molecular structure, $R_1$ can be any one of the following atom or organic groups, such as —H, -alkyl, -branched alkyl, -alkoxy, -ethylene glycol, -alkyl thioether, and other suitable organic groups. $R_2$ can be any of the following atom (e.g. —H) or organic groups comprising from 1 to 20 or from 1 to 12 or from 1 to 6 carbon atoms, these groups include, but not limit to, the following groups, such as -alkyl, -branched alkyl, -alkoxy, -ethylene glycol, alkyl thioether, and other suitable organic groups. $R_3$ can be any of the following atom (e.g. —H) or organic groups comprising from 1 to 20 to from 1 to 12 or from 1 to 6 carbon atoms and can include, but are not limited to, the following groups, such as -alkyl, -branched alkyl, -alkoxy, -ethylene glycol, alkyl thioether, -cyclic and non-aromatic rings, -heterocyclic non-aromatic rings and other suitable organic groups.

In the above molecular structure, the positive charge is on one of the nitrogen atoms in the five-member ring molecule with two nitrogen atoms in the ring framework, but separated each other by one carbon atom.

The counter ion can be any anionic species that possess a negative change when dissolved in aqueous solutions, such as sulfate, nitrate, trifluoroacetate, and other suitable anions.

The ionic liquids that possess the imidazolium salt structure depicted herein are fully soluble in water which makes this type of materials suitable additives to be used in the preparation of slurry in aqueous solutions used for CMP process.

The ionic liquid described herein exhibit at least one of the following properties:

A. Imidazolium based ionic liquids are highly conductive liquid, and fully soluble in water; B. Imidazolium salts, when in its pure form, are good conductors for the enhancement of charge transfer processes that occur in CMP slurry induced redox reactions in CMP processes; C. Ionic liquids, when dissolved in water, the unit of cations still has coordinating reactivity toward cupric ions on the surface; this type of coordination activity is contributed either from the lone pair electrons of the uncharged nitrogen atom in the ring structure or from the suitable functional groups attached at positions of 1 or 2; and/or D. Suitable anions of ionic liquids also are able to bond to the cupric cations on the surface and thereby enhance the dissolution process of cupric complexes.

In certain embodiments, the polishing composition and method using same allows independent tune-ability of copper with respect to other substrate surfaces, such as, but not limited to, Ta, TaN, $Si_3N_4$ and others.

Levels of ionic liquid useful that can be used in the polishing composition range from about 1 ppm to about 1 weight percent (10,000 ppm). In one embodiment, the level of ionic liquid ranges from about 5 ppm to about 5000 ppm. In another embodiment, the level of ionic liquid ranges from about 25 ppm to about 500 ppm.

The polishing compositions and methods using same can have a pH value that ranges from about 4 to about 10. In one embodiment, the pH ranges from about 5 to about 8. In another embodiment, the pH ranges from about 6 to about 8. In yet another embodiment, the pH ranges from about 6.5 to about 7.5. In a further embodiment, the polishing composition has a pH value near 7 (neutral).

As previously mentioned, the polishing composition further comprises an abrasive. Suitable abrasives for this invention include, but are not limited to, alumina, ceria, Germania, silica, titania, zirconia, and mixtures thereof. In one embodiment, the abrasive is silica such as, for example, colloidal silica or fumed silica. In another embodiment, the abrasive is colloidal silica. The abrasive level in the polishing composition can range from in concentration of about 10 ppm to about 25 weight % of the total weight of the polishing composition. In one particular embodiment, the abrasive level is relatively low and may ranges from about 10 ppm to about 2 weight percent of the total weight of the polishing composition. In an alternative embodiment, the abrasive level is about 10 ppm to about 1 weight percent of the total weight of the polishing composition. In a still further embodiment, the abrasive level may range from about 25 ppm to about 100 ppm of the total weight of the polishing composition.

The polishing composition may optionally include an oxidizing agent. In embodiments having an oxidizing agent, the oxidizing agent can be any suitable oxidizing agent. Suitable oxidizing agents include, for example, one or more per-compounds, which comprise at least one peroxy group (—O—O—). Suitable per-compounds include, for example, peroxides, persulfates (e.g., monopersulfates and dipersulfates), percarbonates, and acids thereof, and salts thereof, and mixtures thereof. Other suitable oxidizing agents include, for example, oxidized halides (e.g., chlorates, bromates, iodates, perchlorates, perbromates, periodates, and acids thereof, and mixtures thereof, and the like), perboric acid, perborates, percarbonates, peroxyacids (e.g., peracetic acid, perbenzoic acid, m-chloroperbenzoic acid, salts thereof, mixtures thereof, and the like), permanganates, chromates, cerium compounds, ferricyanides (e.g., potassium ferricyanide), mixtures thereof, and the like. Some specific oxidizers that are useful in composition and method described herein include, but are not limited to, hydrogen peroxide, periodic acid, potassium iodate, potassium permanganate, ammonium persulfate, ammonium molybdate, ferric nitrate, nitric acid, potassium nitrate, ammonia, and other amine compounds, and mixtures thereof. Preferred oxidizing agents include, for example, hydrogen peroxide and urea-hydrogen peroxide.

In one particular embodiment, the composition comprises (hydrogen peroxide) $H_2O_2$ as an oxidizing agent. In this embodiment, the concentration of $H_2O_2$ may range from about 0.2 weight % to about 5 weight % of the total weight of the polishing composition. In another embodiment, the concentration of $H_2O_2$ may range from about 0.5 weight % to about 2 weight % of the total weight of the polishing composition. In yet another embodiment, the concentration of $H_2O_2$ may range from about 0.5 weight % to about 1.5 weight % of the total weight of the slurry.

Other chemicals that may be optionally added to the CMP polishing composition include, for example, surfactants, pH-adjusting agents, acids, corrosion inhibitors, fluorine-containing compounds, chelating agents, nitrogen-containing compounds, salts, biological agents, and combinations thereof.

In embodiments wherein a surfactant is added to the polishing composition, suitable surfactant compounds that may be added to the polishing composition include, for example, any of the numerous nonionic, anionic, cationic or amphoteric surfactants known to those skilled in the art. In these embodiments, the surfactant may present in the composition may range from about 0 weight % to about 1 weight % or from about 0.001 weight % to about 0.1 weight % of the total weight of the composition. In one particular embodiment, the surfactant(s) are nonionic, anionic, or mixtures thereof and are present in a concentration ranging about 10 ppm to about 1000 ppm of the total weight of the slurry. One suitable nonionic surfactant is Surfynol® 104E, which is a 50:50 mixture by weight of 2,4,7,9-tetramethyl-5-decyn-4,7-diol and ethylene glycol (solvent), (Air Products and Chemicals, Allentown, Pa.). Another suitable anionic surfactants includes cetyl trimethylammonium bromide and ammonium lauryl sulfate. In other embodiments, the polishing composition does not include a surfactant.

In certain embodiments, the polishing composition further comprises a pH-adjusting agent. In these embodiments, the pH-adjusting agent may be used, for example, to improve the stability of the polishing composition, improve the safety in handling and use, and/or meet the requirements of various regulations. The pH-adjusting agent may be used to raise or lower the pH of the polishing composition. Suitable pH-adjusting agents to lower the pH of the polishing composition include, but are not limited to, hydrochloric acid, nitric acid, sulfuric acid, chloroacetic acid, tartaric acid, succinic acid, citric acid, malic acid, malonic acid, various fatty acids, various polycarboxylic acids and mixtures thereof. Suitable pH-adjusting agents to raise the pH of the polishing composition include, but are not limited to, potassium hydroxide, sodium hydroxide, ammonia, tetramethylammonium hydroxide, ethylenediamine, piperazine, polyethyleneimine, modified polyethyleneimines, and mixtures thereof.

In certain embodiments, the polishing composition further comprises an acid compound. Suitable acid compounds that may be added to the polishing composition include, but are not limited to, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. In these embodiments, the acid compound(s) may be present in the polishing composition in an amount ranging from about 0 weight % to about 1 weight % of the total weight of the slurry.

In certain embodiments, the polishing composition further comprises a fluorine-containing compound to, for example, increase the removal rates of the slurry for tantalum and tantalum compounds as well as copper relative to silicon dioxide. Suitable fluorine-containing compounds include, but are not limited to, hydrogen fluoride, perfluoric acid, alkali metal fluoride salt, alkaline earth metal fluoride salt, ammonium fluoride, tetramethylammonium fluoride, ammonium bifluoride, ethylenediammonium difluoride, diethylenetriammonium trifluoride, and mixtures thereof. The fluorine-containing compounds may be present in the polishing composition in a concentration of about 0 weight % to about 5 weight %, or about 0.10 weight % to about 2 weight % of the total weight of the polishing composition. In one particular embodiment, the fluorine-containing compound is ammonium fluoride, which is present in a concentration of about 0 weight % to about 1 weight % of the total weight of the polishing composition.

In certain embodiments, the polishing composition further comprises a chelating agent. Suitable chelating agents that may be added to the polishing composition include, but are not limited to, ethylenediaminetetracetic acid (EDTA), N-hydroxyethylethylenediaminetriacetic acid (NHEDTA), nitrilotriacetic acid (NTA), diethylenetriaminepentacetic acid (DPTA), ethanoldiglycinate, tricine, 2,2'-bipyridyl, tartaric acid, glutamic acid, aspartic acid, glutamine, L-aspartic acid, L-tryptophan, L-asparagine, L-arginine and mixtures thereof. The chelating agents may be present in the polishing composition in a concentration of about 0 weight % to about 3 weight %, and are preferably present in a concentration of about 0.05 weight % to about 0.20 weight % of the total weight of the polishing composition. Preferred chelating agents are tricine and EDTA and are most preferably present in a concentration of about 0.05 weight % to about 0.20 weight % of the total weight of the polishing composition.

In certain embodiments, the polishing composition further comprises nitrogen-containing compounds. Suitable nitrogen-containing compounds that may be added to the polishing composition include, but are not limited to, ammonium hydroxide, hydroxylamine, monoethanolamine, diethanolamine, triethanolamine, diethyleneglycolamine, N-hydroxylethylpiperazine, polyethyleneimine, modified polyethyleneimines, and mixtures thereof. Suitable nitrogen-containing compounds also include various amino acids. Suitable amino acids include, but are not limited to, alanine, arginine, asparagine, aspartic acid, cysteine, glutamic acid, glutamine, glycine, histidine, isoleucine, leucine, lysine, methionine, phenylalanine, proline, serine, threonine, tryptophan, tyrosine, and valine. In an embodiment, the amino acid is glycine. The nitrogen-containing compounds may be present in the polishing composition in a concentration of about 0 weight % to about 1 weight %, or present in a concentration of about 0.01 weight % to about 0.20 weight % of the total weight of the polishing composition.

In certain embodiments, the polishing composition further comprises a corrosion inhibitor. Suitable corrosion inhibitors for use in the polishing compositions and associated methods described herein include benzotriazole, 6-tolyltriazole, 1,2,3-triazole, 1,2,4-triazole, 1-dodecanethiol, 3-amino-triazole, 3-amino-1,2,3-triazole-5-thiol, 1-phenyl-1H-tetrazole-5-thiol, 2-mercaptobenzothiazole, hexanethiol, 5-methyl-1H-benzotriazole, 2-amino-4-thiazole-acetic acid, dodecanethiol and combinations thereof.

In certain embodiments, the polishing composition further comprises a salt. Suitable salts that may be added to the polishing composition include, but are not limited to, ammonium persulfate, potassium persulfate, potassium sulfite, potassium carbonate, ammonium nitrate, potassium hydrogen phthalate, hydroxylamine sulfate, and mixtures thereof. The salts may be present in the polishing composition in a concentration of about 0 weight % to about 10 weight %, or about 0 weight % to about 5 weight % of the total weight of the polishing composition. One particular embodiment of a salt that can be used is ammonium nitrate which is present in a concentration of about 0 weight % to about 0.15 weight % of the total weight of the polishing composition.

In certain embodiments, the polishing composition further comprises biological agents such as bactericides, biocides and fungicides particularly for those embodiments wherein the pH of the polishing composition ranges from about 6 to 9. Suitable biocides, include, but are not limited to, 1,2-benzisothiazolin-3-one; 2(hydroxymethyl)amino ethanol; 1,3-dihydroxymethyl-5,5-dimethylhydantoin; 1-hydroxymethyl-5,5-dimethylhydantion; 3-iodo-2-propynyl butylcarbamate; glutaraldehyde; 1,2-dibromo-2,4-dicyanobutane; 5-chloro-2-methyl-4-isothiazoline-3-one; 2-methyl-4-isothiazolin-3-one; and mixtures thereof.

The associated methods described herein entail use of the aforementioned composition for chemical mechanical planarization of substrates comprised of metals and dielectric materials. In the methods, a substrate (e.g., a wafer) is placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and to apply a downward pressure against the backside of the substrate during CMP processing while the platen and the substrate are rotated. The polishing composition (slurry) is applied (usually continuously) on the pad during CMP processing to effect the removal of material to planarize the substrate.

The polishing composition and associated methods described herein are effective for CMP of a wide variety of substrates, including substrates having dielectric portions that comprise materials having dielectric constants less than 3.3 (low-k materials). Suitable low-k films in substrates include, but are not limited to, organic polymers, carbon-doped oxides, fluorinated silicon glass (FSG), inorganic porous oxide-like materials, and hybrid organic-inorganic materials. Representative low-k materials and deposition methods for these materials are summarized below.

| Vendor | Trade Name | Deposition Method | Material |
|---|---|---|---|
| Air Products and Chemicals | MesoElk ® | Spin-on | Hybrid organic-inorganic |
| Applied Materials | Black Diamond | CVD | Carbon-doped oxide |
| Dow Chemical | SiLK ™, Porous SiLK ™ | Spin-on | Organic polymer |
| Honeywell Electronic Materials | NANOGLASS ® E | Spin-on | Inorganic oxide-like |
| Novellus Systems | CORAL ® | PECVD | Carbon-doped oxide |

PECVD = Plasma enhanced chemical vapor deposition
CVD = chemical vapor deposition Current copper CMP technology uses a two-step process to achieve local and global planarization in the production of IC chips. During copper CMP in step 1, the overburden copper is removed during IC fabrication processing. After removing the overburden copper in step 1, the polished surface still has not achieved local and global planarity due to differences in the step heights between high density and low density features on pattern wafers. After removing the overburden copper in step 1, a high tantalum to copper selectivity is desired to achieve local and global planarization. A challenging task is to maintain high tantalum removal while achieving high tantalum to copper selectivity and protection of the low lying copper regions. If the low lying copper regions are not protected during polishing, this results in a defect commonly known as "dishing". A polishing composition which can increase the tantalum to copper selectivity during polishing in step 2 can reduce "dishing" by providing wide overpolish window during chip fabrication processing.

In one embodiment, method described herein is used for chemical mechanical planarization of a surface having at least one feature thereon comprising a metal, wherein the metal is copper.

The polishing composition and method described herein will be illustrated in more detail with reference to the following Examples, but it should be understood that it is not deemed to be limited thereto.

EXAMPLES

Glossary

Components

| | |
|---|---|
| PETEOS | Plasma enhanced deposition of tetraethoxy silane, dielectric oxide layer. |
| Polishing Pad | Polishing pad, Politex ®, and IC1000 were used during CMP, supplied by Rodel, Inc, Phoenix, AZ. |
| TEOS | Tetraethyl orthosilicate |

Parameters
General
Å: angstrom(s)—a unit of length
BP: back pressure, in psi units CMP: chemical mechanical planarization=chemical mechanical polishing CS: carrier speed DF: Down force: pressure applied during CMP, units psi min: minute(s)

ml: milliliter(s)

mV: millivolt(s)

psi: pounds per square inch

PS: platen rotational speed of polishing tool, in rpm (revolution(s) per minute)

SF: polishing composition flow, ml/min

Removal Rates and Selectivities

| | |
|---|---|
| Cu RR 1.5 psi | Measured copper removal rate at 1.5 psi down pressure of the CMP tool |
| Ta RR 1.5 psi | Measured tantalum removal rate at 1.5 psi down pressure of the CMP tool |
| TEOS RR 1.5 psi | Measured TEOS removal rate at 1.5 psi down pressure of the CMP tool |
| PETEOS RR 1.5 psi | Measured PETEOS removal rate at 1.5 psi down pressure of the CMP tool |

General Experimental Procedure

All percentages are weight percentages unless otherwise indicated. In the examples presented below, CMP experiments were run using the procedures and experimental conditions given below. The CMP tool that was used in the examples is a Mirra®, manufactured by Applied Materials, 3050 Boweres Avenue, Santa Clara, Calif., 95054. A Rodel Politex® embossed pad, supplied by Rodel, Inc, 3804 East Watkins Street, Phoenix, Ariz., 85034, was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by DuPont Air Products NanoMaterials L.L.C., at baseline conditions. Polishing experiments were conducted using electrochemically deposited copper, tantalum, and PETEOS wafers. These blanket wafers were purchased from Silicon Valley Microelectronics, 1150 Campbell Ave, Calif., 95126. The film thickness specifications are summarized below:

PETEOS: 15,000 Å on silicon

Copper: 10,000 Å electroplated copper/1,000 Å copper seed/250 Å Ta on silicon

Tantalum: 2000 Å/5,000 Å thermal oxide on silicon

Example 1

A polishing composition of CopperReady® Cu3900, commercially available from DuPont Air Products NanoMaterials, L.L.C., Tempe, Ariz., was used in this example as a comparative polishing composition. To this comparative polishing composition was added the ionic liquid compound 1,2,3-trimethylimidiazolium sulfate (supplied by Sigma Aldrich, Milwaukee, Wis.) to provide the polishing composition described herein. Testing was done with 5 parts per million (PPM) and 25 parts per million of 1,2,3-trimethylimidiazolium sulfate being added to this comparative polishing composition. Polishing experiments were done to compare these inventive compositions to the comparative composition. The polishing data indicated that the copper removal rate was increased using a polishing composition containing 1,2,3-trimethylimidiazolium sulfate. The measured removal rates of copper and WIW NU % using the polishing composition with this ionic liquid compound as an additive are 358 nm/minute with WIW NU % equal to 3.66%, and 374 nm/minute with WIW NU % equal to 3.83%, respectively, corresponding to the additive concentrations of 5 parts per million (PPM), and 25 parts per million (PPM) in the composition, respectively. By comparison, the measured removal rate of copper and WIW NU % values using the CopperReady® Cu3900 polishing composition that did not contain 1,2,3-trimethylimidiazolium sulfate in the polishing composition are 281 nm/minute and WIW NU % equal to 6.87%. (Polishing conditions in all cases were down force=1.5 psi, polishing composition flow rate=200 ml/minute, and table speed=93 rpm.)

Example 2

Into the CopperReady® Cu3900 composition (as described in Example 1) was added 250 PPM of the ionic compound 1,2,3-trimethylimidiazolium sulfate to afford the inventive polishing composition for this example. This polishing composition was used to polish patterned wafers while the CopperReady® Cu3900 polishing composition was also used to polish the patterned wafers as a reference (comparative sample). This polishing experiment was repeated in the same manner except that 1000 PPM of 1,2,3-trimethylimidiazolium sulfate was used instead of 250 PPM. In both cases, there were no polishing residues observed on the surface of the polished wafers using the polishing compositions that contained the 1,2,3-trimethylimidiazolium sulfate as additive. There were minor polishing residues observed on the surfaces of the polished patterned wafers using the CopperReady® Cu3900 composition (without containing 1,2,3-trimethylimidiazolium sulfate as additive). (Polishing conditions were down force=1.5 psi, polishing composition flow rate=200 ml/minute, and table speed=93 rpm.)

The results of Example 1 indicated that not only the removal rates of copper are substantially increased using an imidiazolium-type ionic liquid as additive in the polishing compositions, but also the within a wafer non-uniformity (WIW NU %) is also substantially improved (lowered) using this type of additive in the copper polishing slurry.

The results of Example 2 indicated that the use of ionic liquid type additive lead to the clean wafer surface after polishing.

The results shown above indicated that ionic liquid compounds, such as 1,2,3-trimethylimidiazolium sulfate, are suitable novel additives to be used in different concentration ranges in tuning copper polishing rate, improving WIW NU %, and preventing residues produced during polishing from remaining on the surface of polished wafers subsequent to CMP processing.

The invention claimed is:

1. A metal surface polishing composition comprising:
a) an abrasive ranging from 10 ppm to about 100 ppm;
b) an ionic liquid compound comprising an imidazolium salt having the general molecular structure:

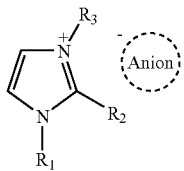

where $R_1$ is selected from H, normal-alkyl, branched alkyl, alkoxy, and alkyl thioether groups; $R_2$ is selected from H, normal-alkyl, branched alkyl, alkoxy, and alkyl thioether groups; $R_3$ is selected from normal-alkyl, branched alkyl, alkoxy, alkyl thioether, cyclic and non-aromatic rings, heterocyclic non-aromatic rings and other suitable organic groups; and anion is selected from a univalent and a multivalent anion; and
c) an oxidizing agent
d) a substrate comprising a metal surface;
e) a polishing pad.

2. The composition of claim 1 wherein the anion is selected from the group consisting of sulfate, bisulfate, nitrate, trifluoroacetate, and fluorosulfonate.

3. The composition of claim 1 wherein the ionic liquid compound is 1,2,3-trimethylimidiazolium sulfate.

4. The composition of claim 1 wherein the oxidizing agent is selected from the group consisting of hydrogen peroxide, periodic acid, potassium iodate, potassium permanganate, ammonium persulfate, ammonium molybdate, ferric nitrate, nitric acid, potassium nitrate, ammonia, amine compounds, and mixtures thereof.

5. The composition of claim 4 wherein the oxidizing agent is hydrogen peroxide.

6. The composition of claim 1 wherein the abrasive is colloidal silica.

7. The composition of claim 1 wherein the polishing composition has a pH from about 4 to about 10.

8. The composition of claim 1 wherein the polishing composition has a pH from about 5 to about 8.

* * * * *